(12) United States Patent
Chehade et al.

(10) Patent No.: US 11,240,936 B2
(45) Date of Patent: Feb. 1, 2022

(54) RACK ARRANGEMENT FOR A DATA CENTER

(71) Applicant: OVH, Roubaix (FR)

(72) Inventors: Ali Chehade, Templeuve (FR); Angelos Lyris, Toulouse (FR); Henryk Klaba, Roubaix (FR)

(73) Assignee: OVH, Roubaix (FR)

( * ) Notice: Subject to any disclaimer, the term of this patent is extended or adjusted under 35 U.S.C. 154(b) by 0 days.

(21) Appl. No.: 16/680,087

(22) Filed: Nov. 11, 2019

(65) Prior Publication Data
US 2020/0163256 A1    May 21, 2020

(30) Foreign Application Priority Data

Nov. 15, 2018    (EP) .................................... 18315044

(51) Int. Cl.
*H05K 7/20* (2006.01)
*H05K 7/18* (2006.01)

(52) U.S. Cl.
CPC ........... *H05K 7/20727* (2013.01); *H05K 7/18* (2013.01)

(58) Field of Classification Search
None
See application file for complete search history.

(56) References Cited

U.S. PATENT DOCUMENTS

| | | |
|---|---|---|
| 6,616,524 B2 | 9/2003 | Storck, Jr. et al. |
| 6,775,137 B2 | 8/2004 | Chu et al. |
| 7,447,022 B2 | 11/2008 | Murakami et al. |
| 7,688,578 B2 | 3/2010 | Mann et al. |
| 8,004,839 B2 | 8/2011 | Sato et al. |
| 8,031,468 B2 | 10/2011 | Bean, Jr. et al. |
| 8,259,449 B2 | 9/2012 | Novotny et al. |
| 8,425,287 B2 | 4/2013 | Wexler |
| 8,482,918 B2 | 7/2013 | Chang |
| 8,879,270 B2 | 11/2014 | Chen et al. |
| 8,885,341 B2 | 11/2014 | Desmarets |
| 8,929,075 B2 | 1/2015 | Eckberg et al. |
| 9,629,285 B1 | 4/2017 | Lachapelle et al. |

(Continued)

FOREIGN PATENT DOCUMENTS

WO    2012164261 A2    12/2012

OTHER PUBLICATIONS

Extented European Search Report with regard to the counterpart EP Patent Application No. 18315044.0 dated Apr. 18, 2019.

(Continued)

*Primary Examiner* — Courtney L Smith
(74) *Attorney, Agent, or Firm* — BCF LLP

(57) ABSTRACT

A rack arrangement for a data center includes at least one row of racks including a plurality of computer racks and an air handler rack. Each computer rack includes a computer rack frame including a housing unit for housing computer equipment. The air handler rack includes an air handler rack frame, a heat exchanger and at least one fan. The at least one fan is configured for pulling air into the air handler rack via an air inlet side and discharging air via an air outlet side of the air handler rack, directing air through the heat exchanger. An air inlet side of any one of the computer racks and the air outlet side of the air handler rack are on a cold aisle side of the at least one row of racks. At least one selected rack is stacked atop the air handler rack.

10 Claims, 12 Drawing Sheets

(56) References Cited

U.S. PATENT DOCUMENTS

| | | | |
|---|---|---|---|
| 9,635,785 | B1 | 4/2017 | Heydari et al. |
| 2008/0164794 | A1 | 7/2008 | Lai et al. |
| 2009/0255653 | A1 | 10/2009 | Mills et al. |
| 2011/0063778 | A1 | 3/2011 | Brouillard |
| 2011/0189936 | A1 | 8/2011 | Haspers et al. |
| 2012/0134108 | A1 | 5/2012 | Brouillard |
| 2014/0331582 | A1* | 11/2014 | Klaba .................. H05K 7/1497 52/234 |
| 2015/0359131 | A1 | 12/2015 | Moore et al. |
| 2016/0014932 | A1 | 1/2016 | Best et al. |
| 2018/0295751 | A1* | 10/2018 | Jochim ................ H05K 7/1489 |
| 2019/0261534 | A1* | 8/2019 | Jochim .............. H05K 7/20781 |

OTHER PUBLICATIONS

"In-Row Cooling", Weatherite Air Conditioning, pdf 4 pages retrieved from https://www.weateriteac.com/product/row-cooling on Jul. 25, 2018.

"Server Rack Air Conditioner", Euroklimat, pdf 3 pages retrieved from http://www.ekhvacsystems.com/sale-4840770-server-rack-air-conditioner-network-cabinet-precision-air-conditioner.html on Jul. 25, 2018.

"Intelligent Precision Cooling For Data Center Equipment", VERTIV, Liebert, CRV tm Row-Based Cooling, AHRI Certified, https://www.ahridirectory.org, pdf 12 pages.

Rabassa III, "Economic Performance of Modularized Hot-Aisle Contained Datacenter PODs Utilizing Horizontal Airflow Cooling", M.S. Information Systems and Technology, Johns Hopkins University, 2014, 85 pages.

\* cited by examiner

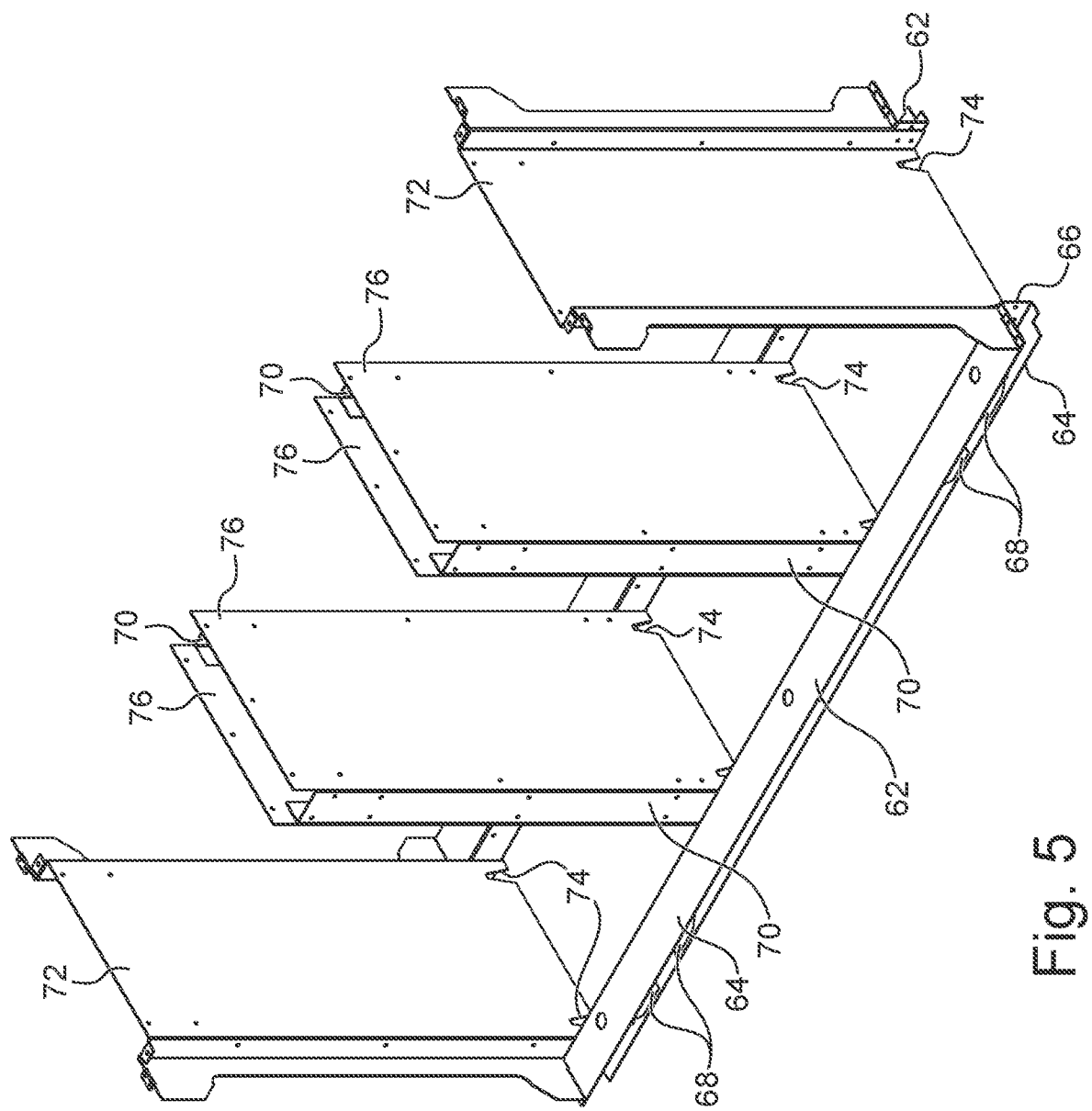

RACK ARRANGEMENT FOR A DATA CENTER

CROSS-REFERENCE

The present application claims priority to European Patent Application No. 18315044.0, filed on Nov. 15, 2018, the entirety of which is incorporated herein by reference.

FIELD OF TECHNOLOGY

The present technology relates to rack arrangements for data centers.

BACKGROUND

Heat management is an important consideration when planning the implementation of a data center. Notably, the computer equipment (e.g., servers, power supplies, etc.) stored therein generates a significant amount of heat that must be evacuated to maintain efficient and functional operation of the computer equipment.

Different types of heat management solutions are available to address this issue including, for example, computer room air handlers (CRAH) and in-row air handlers. However, these solutions typically require a significant amount of floor space within the data center that could otherwise be occupied by the racks used to house the computer equipment. In addition, these solutions can be expensive to implement as they may require additional structure within the data center such as a false floor and/or ceiling for the circulation of heated or cold air therein which in turn may also make difficult the selection of an appropriate facility for the data center. Furthermore, the implementation of such conventional air handler units typically has to be foreseen during planning of the layout of the data center such as to ensure that sufficient space is left to integrate the air handler units into the data center.

There is therefore a desire for a rack arrangement for a data center which can alleviate at least some of these drawbacks.

SUMMARY

It is an object of the present technology to ameliorate at least some of the inconveniences present in the prior art.

According to one aspect of the present technology, there is provided a rack arrangement for a data center. The rack arrangement includes at least one row of racks aligned with one another in a row configuration. Each of the at least one row of racks has a cold aisle side and a hot aisle side opposite the cold aisle side. The at least one row of racks includes a plurality of computer racks, each computer rack including a computer rack frame. The computer rack frame includes a housing unit for housing computer equipment. Each computer rack has an air inlet side for ingress of air into the computer rack and an air outlet side for egress of air out of the computer rack. The at least one row of racks also includes an air handler rack having an air inlet side and an air outlet side. The air handler rack includes: an air handler rack frame; a heat exchanger supported by the air handler rack frame, and at least one fan supported by the air handler rack frame. The heat exchanger includes a coil for circulating cooling fluid therein. The coil has a fluid inlet for receiving cooling fluid into the coil and a fluid outlet for discharging cooling fluid from the coil. The at least one fan is configured for pulling air into the air handler rack via the air inlet side of the air handler rack and discharging air via the air outlet side of the air handler rack. The at least one fan directs air through the heat exchanger. The air inlet side of any one of the computer racks and the air outlet side of the air handler rack being on the cold aisle side of the at least one row of racks. At least one selected rack of the row of racks is stacked atop the air handler rack.

In some embodiments of the present technology, the at least one selected rack includes at least one computer rack of the plurality of computer racks.

In some embodiments of the present technology, the at least one computer rack includes a first computer rack and a second computer rack of the plurality of computer racks.

In some embodiments of the present technology, the air handler rack is a first air handler rack. The at least one selected rack includes a second air handler rack stacked atop the first air handler rack.

In some embodiments of the present technology, the at least one selected rack further includes a third air handler rack stacked atop the second air handler rack.

In some embodiments of the present technology, the at least one selected rack further includes at least one computer rack of the plurality of computer racks.

In some embodiments of the present technology, the at least one computer rack is stacked atop the second air handler rack.

In some embodiments of the present technology, the air handler rack is supported on a ground surface of the data center.

In some embodiments of the present technology, the air handler rack is stacked atop at least one computer rack of the plurality of computer racks.

In some embodiments of the present technology, a length of the computer rack frame is greater than a height of the computer rack frame.

In some embodiments of the present technology, the air handler rack frame has a length that is approximately equal to the length of the computer rack frame; and the air handler rack frame has a height that is approximately equal to the height of the computer rack frame.

In some embodiments of the present technology, the at least one fan includes a plurality of fans, the plurality of fans being disposed side-by-side horizontally.

In some embodiments of the present technology, the coil extends across each of the plurality of fans.

In some embodiments of the present technology, the computer rack frame and the air handler rack frame are interchangeably stackable atop one another.

According to another aspect of the present technology, there is provided a method of arranging racks in a data center. The method includes forming at least one row of racks that are aligned with one another in a row configuration. Each of the at least one row of racks has a cold aisle side and hot aisle side opposite the cold aisle side. The at least one row of racks includes a plurality of computer racks, each computer rack comprising a computer rack frame. The computer rack frame includes a housing unit for supporting computer equipment. The at least one row of racks also includes an air handler rack. The air handler rack includes: an air handler rack frame; a heat exchanger supported by the air handler rack frame; and at least one fan supported by the air handler rack frame. The heat exchanger includes a coil for circulating cooling fluid therein. The coil has a fluid inlet for receiving cooling fluid into the coil and a fluid outlet for discharging cooling fluid from the coil. The at least one fan is configured for pulling air into the air handler rack via the air inlet side of the air handler rack and discharging air via the air outlet side of the air handler rack. The at least one fan directs air through the heat exchanger. The air inlet side of any one of the computer racks and the air outlet side of the air handler rack are on the cold aisle side of the at least one row of racks. The method also includes stacking at least one selected rack of the row of racks atop the air handler rack.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 5 is a front, right perspective view of part of an air handler rack frame of the air handler rack of FIG. 3;

DETAILED DESCRIPTION

Figure 1:
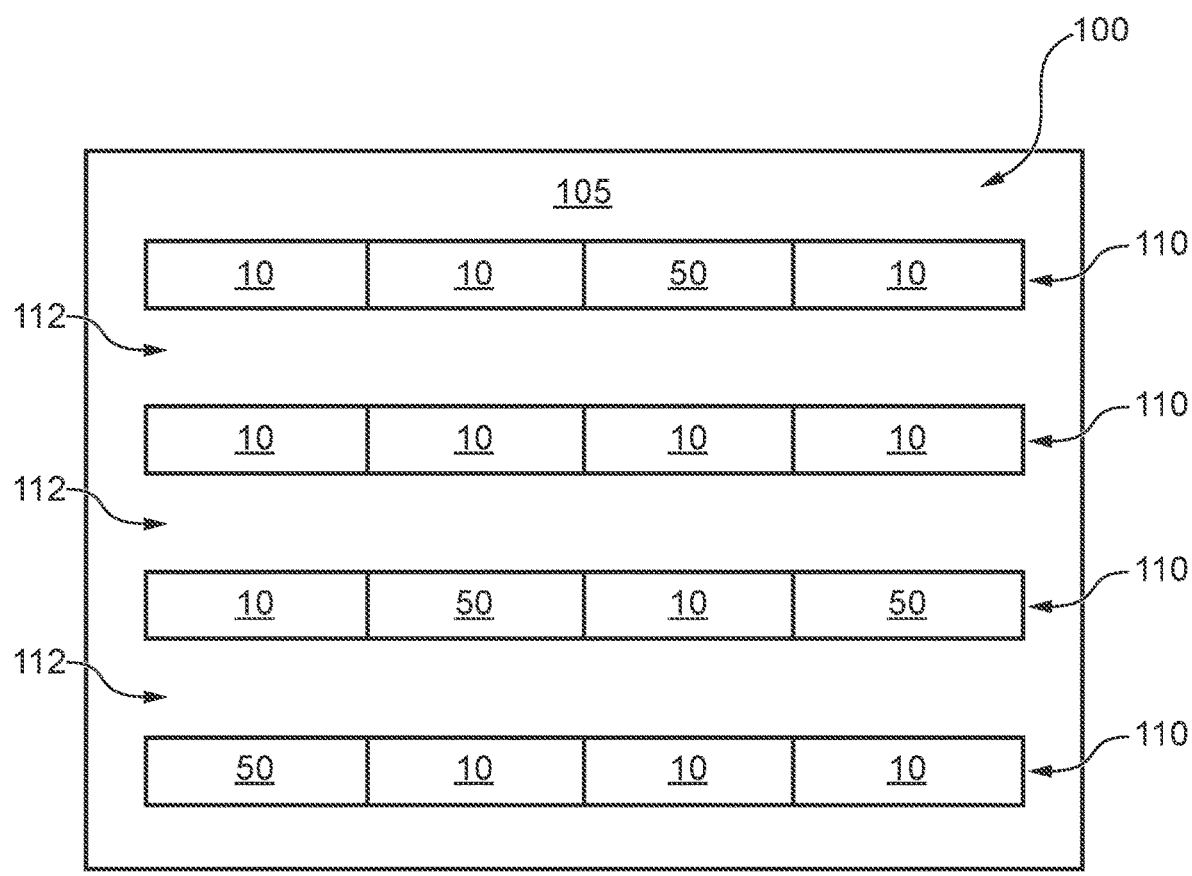
FIG. 1 is a top plan view of a data center.

FIG. 1 illustrates an exemplary layout of a data center 100 in accordance with an embodiment of the present technology. The data center 100 houses multiple computer racks 10 in which computer equipment and associated components can be stored. For instance, in this embodiment, the computer equipment 25 stored in the computer racks 10 includes servers and associated components thereof (e.g., power supplies) such that the computer racks 10 may also be referred to as "server racks". The computer racks 10 are arranged in rows 110 that are spaced apart from one another (forming aisles 112 therebetween) and extend parallel to one another. Each row 110 includes various ones of the computer racks 10 and one or more of the rows 110 includes an air handler rack 50 configured to cool air circulating therethrough.

In accordance with the present technology, as will be described in greater detail below, the air handler racks 50 are configured to be stackable with the computer racks 10. That is, an air handler rack 50 can be stacked atop a computer rack 10 and vice-versa. This may enable a more efficient use of the limited space within the data center 100, notably by allowing the inclusion of a greater amount of computer racks 10 within the data center 100. In addition, the stackability of the air handler racks 50 with the computer racks 10 can facilitate planning of the layout of the data center 100 as the air handler racks 50 can be added to the data center 100 without having to have foreseen their need beforehand.

Figure 2:
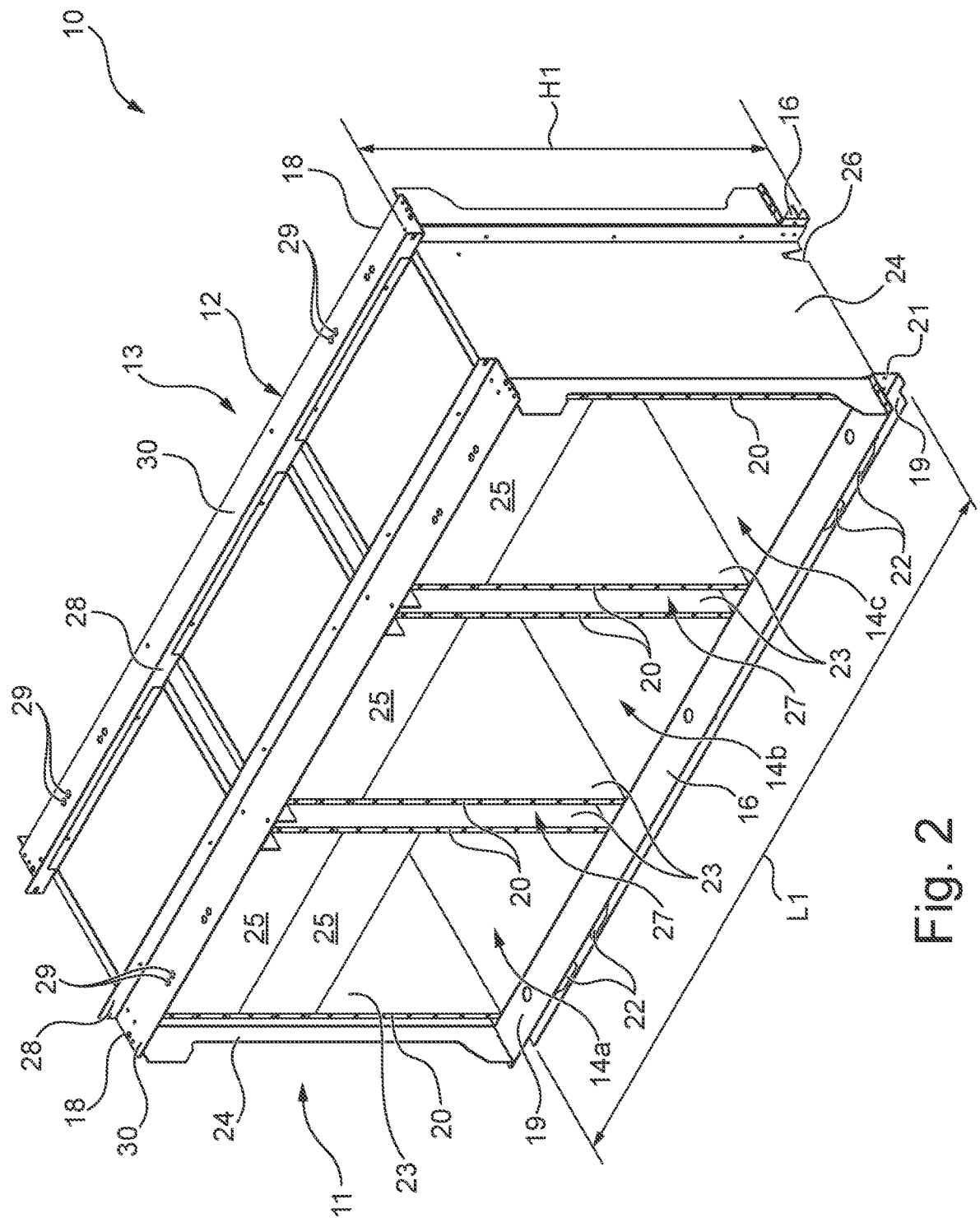
FIG. 2 is a front, right perspective view of a computer rack of the data center of FIG. 1.

An example of one of the computer racks 10 will now be described with respect to FIG. 2. The computer rack 10 has a frame 12 defining housing units 14a, 14b, 14c for housing the computer equipment 25 therein. The computer rack 10 has a front side 11 through which the computer equipment 25 can be inserted and removed from the computer rack 10, and a rear side 13 opposite the front side 11. In order to dissipate heat generated by the computer equipment 25, air generally enters the computer rack 10 through the front side 11 and exits through the rear side 13. The front side 11 and the rear side 13 may thus be referred to as an air inlet side 11 and an air outlet side 13 respectively.

As can be seen, in this embodiment, the frame 12 is "horizontally-extending" in that a greatest dimension of the frame 12 is defined horizontally. Notably, a length L1 of the frame 12, measured horizontally in a longitudinal direction of the computer rack 10, is greater than a height H1 of the frame 12. For instance, a ratio L1/H1 of the length L1 of the frame 12 over the height H1 of the frame 12 may be between 1.4 and 2.2, in some cases between 1.6 and 2, and in some cases between 1.8 and 1.9. In this example of implementation, the ratio L1/H1 is 1.9. The horizontally-extending nature of the frame 12 provides a lower center of gravity of the computer rack 10 compared to conventional computer racks that extend vertically. In addition, and as will be seen in greater detail below, this allows stacking a greater amount of racks 10, 50 atop one another.

The frame 12 has two elongated lower support members 16 and two elongated upper support members 18 disposed vertically above and parallel to the lower support members 16. The lower and upper support members 16, 18 define the length L1 of the frame 12. The lower support members 16 are configured to support the computer rack 10 on a support surface (e.g., the ground surface 105 of the data center 100) or atop another rack as will be described in greater detail below. The upper support members 18 are configured to support another rack 10, 50 stacked atop the computer rack 10.

The lower support members 16 have a generally U-shaped cross-section including two parallel walls 19 and a transversal wall 21 connecting the parallel walls 19. The lower support members 16 are oriented such that one of the parallel walls 19 is vertically above the other parallel wall 19. A lower one of the parallel walls 19 has tool-receiving openings 22 for receiving a positioning tool (not shown) therein for guiding stacking of the computer rack 10 atop another rack or some other supporting structure in a manner which will be further described below.

Each upper support member 18 is generally L-shaped having an upwardly extending portion 28 and a horizontally extending portion 30. The horizontally extending portion 30 is parallel to the walls 19 of the lower support members 16.

In this embodiment, the upwardly extending 28 extends generally vertically (i.e., normal to the horizontally extending portion 30). The horizontally extending portion 30 defines tool-locating openings 29 for receiving a positioning tool therein as will be further described below.

It is contemplated that, in some embodiments, the tool-receiving openings 22 and the tool-locating openings 29 may be omitted.

Elongated vertical beams 20 are fastened (e.g., bolted or welded) to the lower support members 16 and the upper support members 18. Each of the housing units 14a, 14b, 14c is straddled, in the longitudinal direction of the computer rack 10, by two of the vertical beams 20 such that the housing units 14a, 14b, 14c are arranged horizontally side-by-side. Thus, in this example of implementation, six vertical beams 20 are fastened to each of the lower support members 16 and the upper support members 18. Notably, each of the vertical beams 20 is fastened to the transversal wall 21 of a given one of the lower support members 16. Each vertical beam 20 is aligned, in the longitudinal direction of the computer rack 10, with another vertical beam 20 that is affixed to an opposite lower support member 16. The vertical beams 20 define openings for affixing the rack-mountable computer equipment 25 thereto.

Panels 23 are affixed to the vertical beams 20 and extend laterally between laterally-adjacent ones of the vertical beams 20 (i.e., between the vertical beams 20 that are adjacent to one another in the lateral direction of the computer rack 10) to define the housing units 14a, 14b, 14c therebetween. Channels 27 are formed between some of the panels 23 to accommodate cables and/or other components associated with operation of computer equipment such as fluid flow paths for cooling the computer equipment.

End panels 24 are fastened to the ends of each of the lower and upper support members 16, 18. Each of the end panels 24 has two recesses 26 formed at a lower edge thereof between the lower support members 16. Each recess 26 has a generally triangular shape, with an apex of the triangular shape of the recess 26 pointing vertically upwards. The panels 23 also have similar recesses (not shown) aligned with the recesses 26 of the end panels 24.

In this embodiment, the various components of the computer rack frame 12 described above are sheet metal components. Nevertheless, it is contemplated that one or more of these components could be made differently in other embodiments.

Furthermore, the computer rack 10 may include doors (not shown) on the air inlet side 11. In some embodiments, the doors could have fans for promoting air circulation through the computer rack 10 from the air inlet side 11 to the air outlet side 13. Back panels may also be provided on the air outlet side 13 of the computer rack 10.

Figure 4:
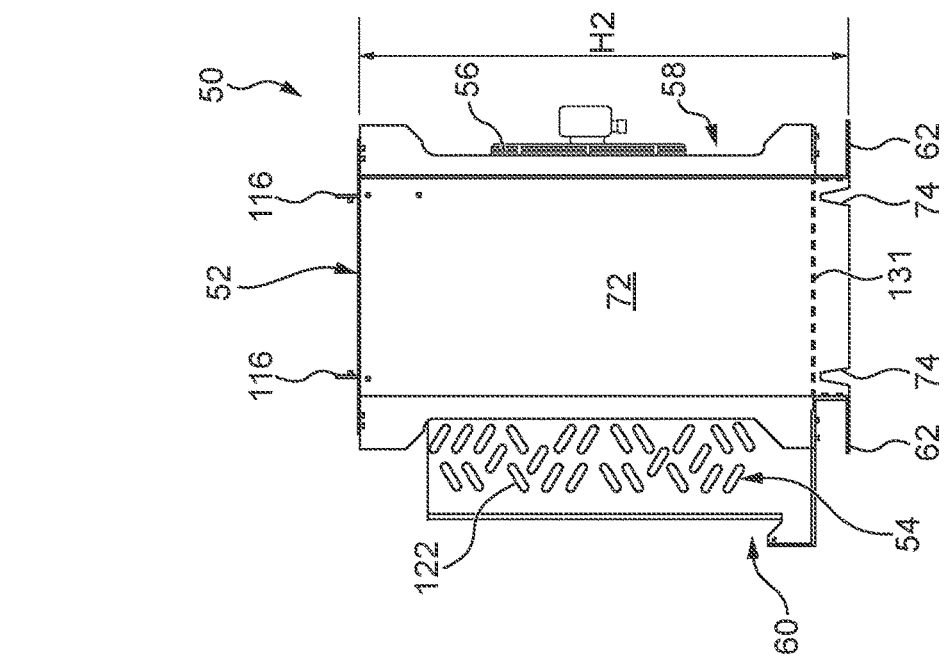
FIG. 4 is a left side elevation view of the air handler rack of FIG. 3.
Figure 3:
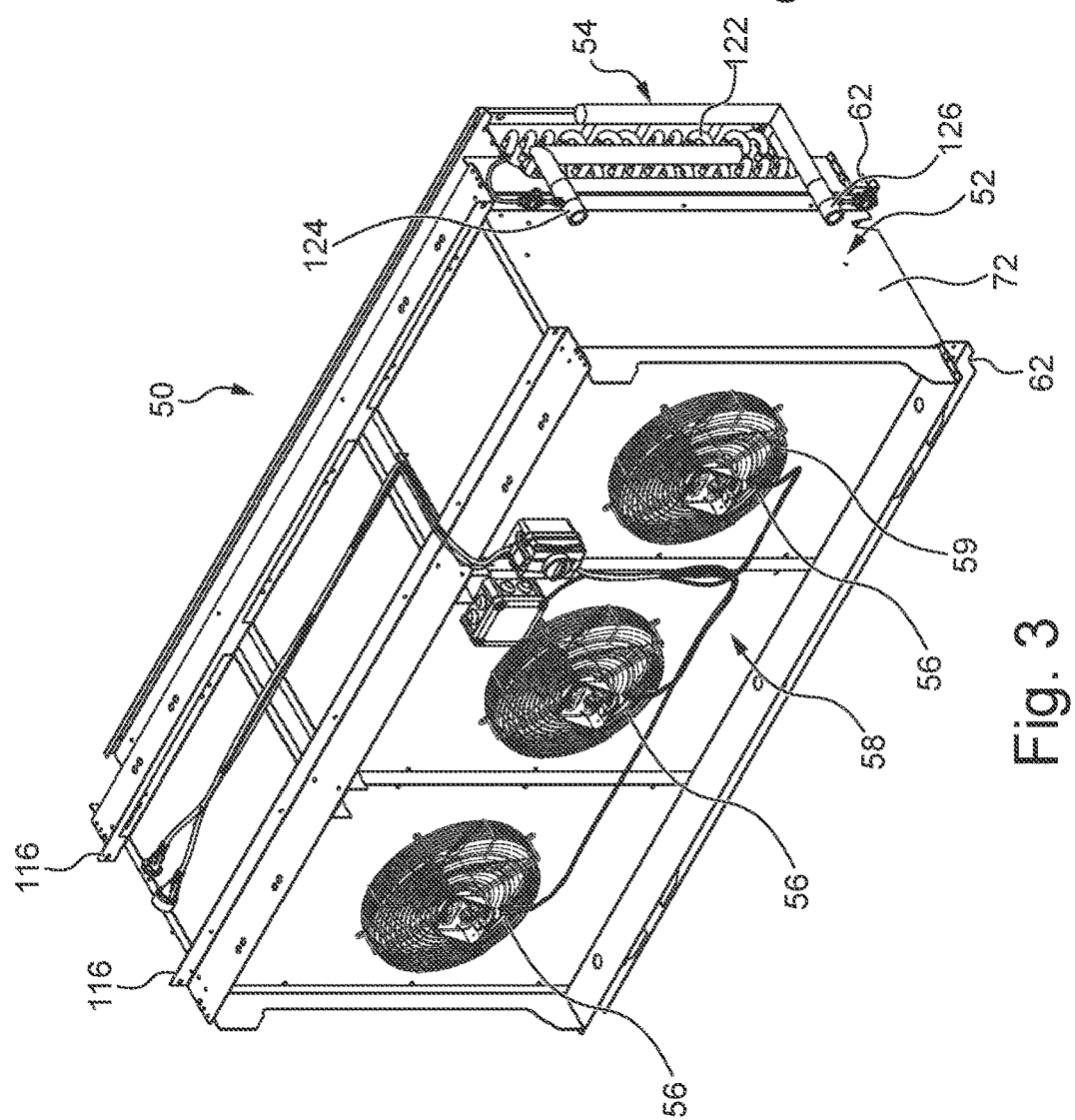
FIG. 3 is a front, right perspective view of an air handler rack of the data center of FIG. 1.

As mentioned above, the air handler racks 50 are positioned within the rows 110 of the data center 100 and remove heat generated by the computer equipment 25 stored in the computer racks 10. Notably, as will be described in greater detail below, the air handler racks 50 are operable to lower a temperature of air traversing the air handler rack 50. To that end, as shown in FIGS. 3 and 4, each air handler rack 50 has an air inlet side 58 for ingress of air into the air handler rack 50 and an air outlet side 60 for egress of air out of the air handler rack 50. The air handler rack 50 has a frame 52, a heat exchanger 54 disposed at the air outlet side 60, and fans 56 disposed at the air inlet side 58.

The frame 52 will now be described with reference to FIGS. 5 to 9 which illustrate the progressive assembly thereof. The frame 52 will be referred to herein as the "air handler rack frame" 52 in order to more clearly distinguish it from the frame 12 of the computer rack 10 which will be referred to as the "computer rack frame" 12.

As shown in FIG. 5, the air handler rack frame 52 has two elongated lower support members 62 for supporting the air handler rack 50 on a support surface or atop another rack as will be described in greater detail below. The lower support members 62 have a generally U-shaped cross-section including two parallel walls 64 and a transversal wall 66 connecting the parallel walls 64. The lower support members 62 are oriented such that one of the parallel walls 64 is vertically above the other parallel wall 64. A lower one of the parallel walls 64 has tool-receiving openings 68 for receiving a positioning tool (not shown) therein for guiding stacking of the air handler rack 50 atop another rack or some other supporting structure (e.g., a pallet).

Elongated vertical beams 70 having a generally U-shaped cross-section are fastened (e.g., bolted or welded) to the lower support members 62. More precisely, in this example of implementation, two vertical beams 70 are fastened to each of the lower support members 62. Notably, each of the vertical beams 70 is fastened to the transversal wall 66 of a given one of the lower support members 62. Each vertical beam 70 is aligned, in the longitudinal direction of the air handler rack 50, with another vertical beam 70 that is affixed to an opposite lower support member 62. The vertical beams 70 affixed to a given one of the lower support members 62 are spaced apart from one another and are evenly distanced from the ends of that lower support member 62.

End panels 72 are fastened to the ends of each of the lower support members 62 and thus interconnect the lower support members 62. Each of the end panels 72 has two recesses 74 formed at a lower edge thereof between the lower support members 62. Each recess 74 has a generally triangular shape, with an apex of the triangular shape of the recess 74 pointing vertically upwards.

The air handler rack frame 52 also has middle panels 76 affixed to laterally opposite ones of the vertical beams 70. More specifically, each of the middle panels 76 is fastened to longitudinally-aligned surfaces of laterally opposite ones of the vertical beams 72. The middle panels 76 have recesses 78 similar to the recesses 74 of the end panels 72 described above. The recesses 78 of the middle panels 76 are laterally aligned with the recesses 74 of the end panels 72. As will be discussed in more detail below, the recesses 74, 78 of the end and middle panels 72, 76 facilitate stacking of the air handler rack frame 52.

Figure 6:
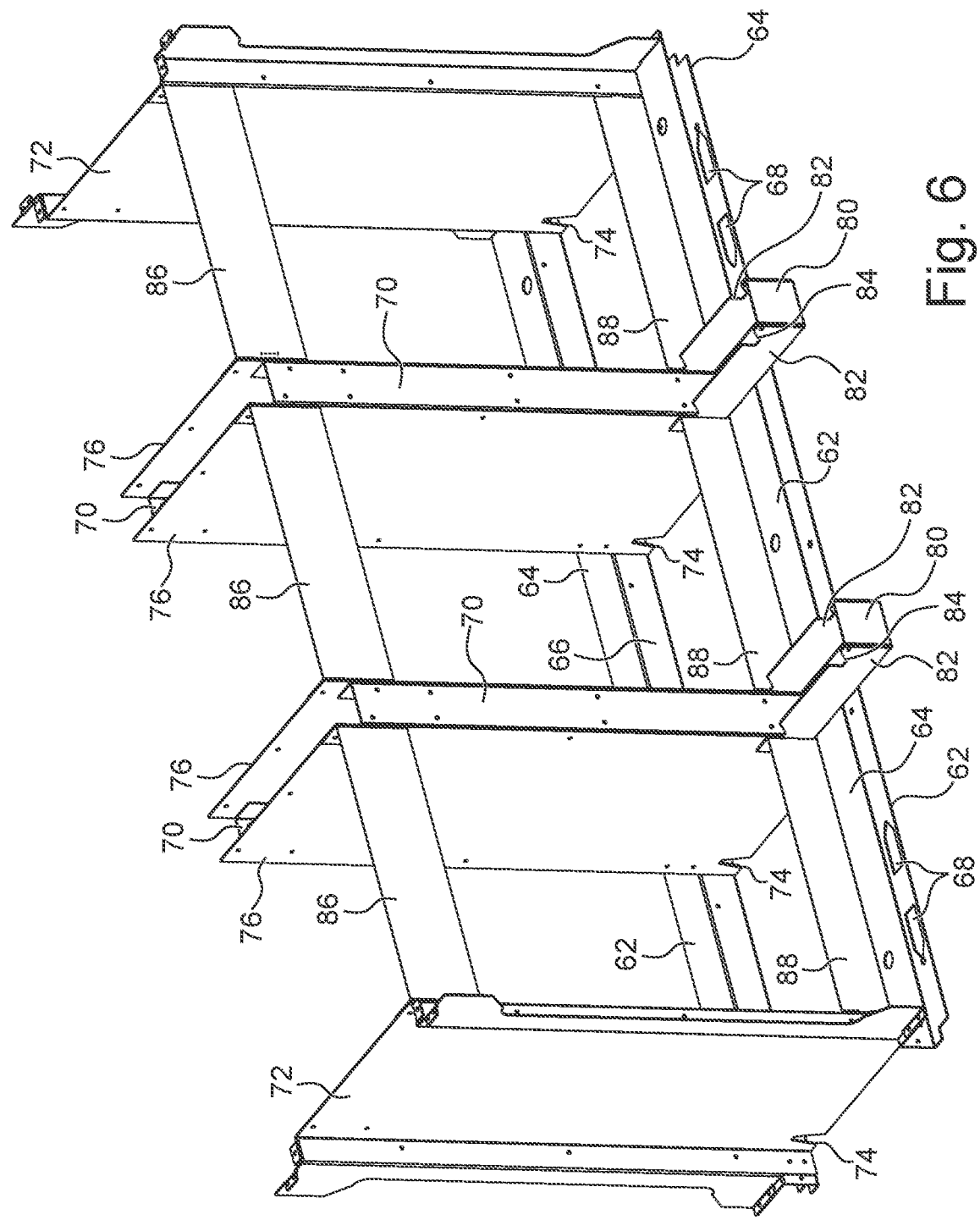
FIG. 6 is a rear, right perspective view of part of the air handler rack frame in a subsequent state of assembly.

With reference to FIG. 6, the air handler rack frame 52 also has, on one side thereof (corresponding to the air outlet side 60 of the air handler rack 50), two heat exchanger support members 80 for supporting the heat exchanger 54. The heat exchanger support members 80 extend generally in the lateral direction of the air handler rack 50 and are disposed atop the upper parallel wall 64 of the corresponding lower support member 62. Each heat exchanger support member 80 has opposite walls 82 that straddle a given one of the vertical beams 70 and the middle panels 76 fastened thereto. The opposite walls 82 of the heat exchanger support member 80 are fastened to the middle panels 76 straddled thereby. Moreover, the opposite walls 82 have recesses 84 on an upper edge thereof for receiving therein a protrusion of the heat exchanger 54 such that the heat exchanger 54 is received securely on the heat exchanger support members 80.

As shown in FIG. 6, upper and lower covering members 86, 88 are provided for preventing air leaking from the air handler rack 50. The lower covering members 88 are adapted for blocking air at a lower portion of the air handler rack frame 52. The lower covering members 88 are generally rectangular flat sheet components and have tabs (not shown) at opposite ends thereof for fitting into slots (not shown) provided in the heat exchanger support members 80. Each of the lower covering members 88 has a rectangular surface extending parallel to the longitudinal direction of the air handler rack 50 and spanning substantially from a given one of the middle panels 76 to another one of the middle panels 76, or from the given one of the middle panels 76 to one of the end panels 72. The upper covering members 86 are adapted for blocking air at an upper portion of the air handler rack frame 52. To that end, the upper covering members 86 are fastened to an upper end of the middle panels 76 and/or the end panels 72. Each of the upper covering members 86 has a rectangular surface extending parallel to the longitudinal direction of the air handler rack 50 and spanning substantially from a given one of the middle panels 76 to another one of the middle panels 76, or from the given one of the middle panels 76 to one of the end panels 72.

Figure 7:
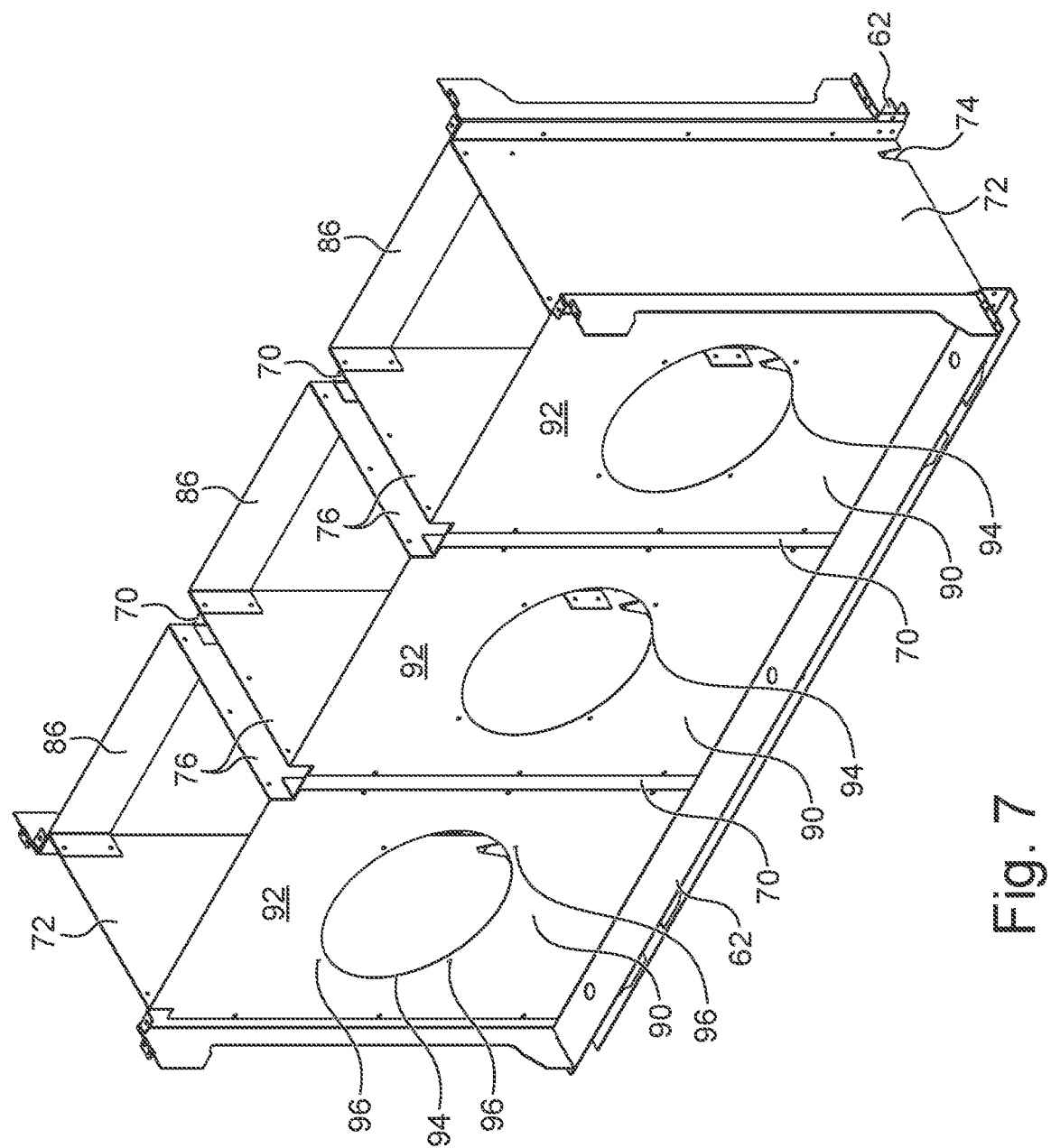
FIG. 7 is a front, right perspective view of part of the air handler rack frame in another subsequent state of assembly.

As shown in FIG. 7, the air handler rack frame 52 also has fan mounting panels 90 on the side of the air handler rack frame 52 corresponding to the air inlet side 58 of the air handler rack 50. Each fan mounting panel 90 is fastened at one longitudinal end to one of the vertical beams 70 and at the opposite longitudinal end to another one of the vertical beams 70 or to one of the end panels 72. Each fan mounting panel 90 has a front surface 92 extending longitudinally and defining a circular aperture 94 for permitting air flow generated by a corresponding fan 56 through the air handler rack 50. Mounting features 96 (e.g., threaded holes) are provided adjacent the aperture 94 to mount the corresponding fan 56 to the fan mounting panel 90.

Figure 8:
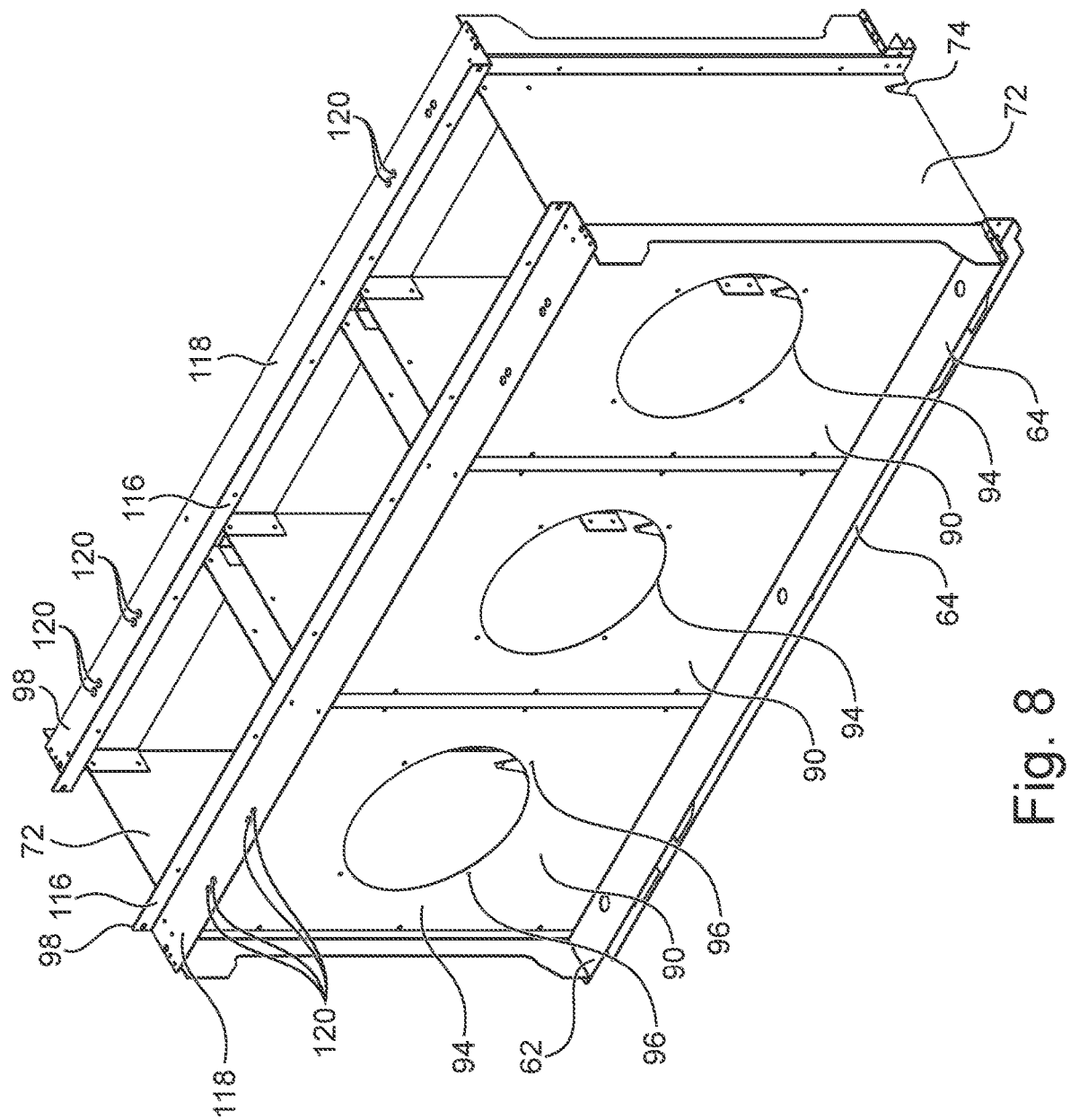
FIG. 8 is a front, right perspective view of part of the air handler rack frame in yet another subsequent state of assembly.

As shown in FIG. 8, the air handler rack frame 52 has upper support members 98 extending parallel to the lower support members 62 and disposed vertically above the lower support members 62. More specifically, the upper support members 98 are fastened to the upper ends of the end panels 72 and to the middle panels 76. Each of the upper support members 98 is generally L-shaped and has an upwardly extending portion 116 and a horizontally extending portion 118. The horizontally extending portion 118 is parallel to the walls 64 of the lower support members 62. In this embodiment, the upwardly extending 116 extends generally vertically (i.e., normal to the horizontally extending portion 118). The horizontally extending portion 118 defines tool-locating openings 120 for receiving a tool therein.

Figure 9:
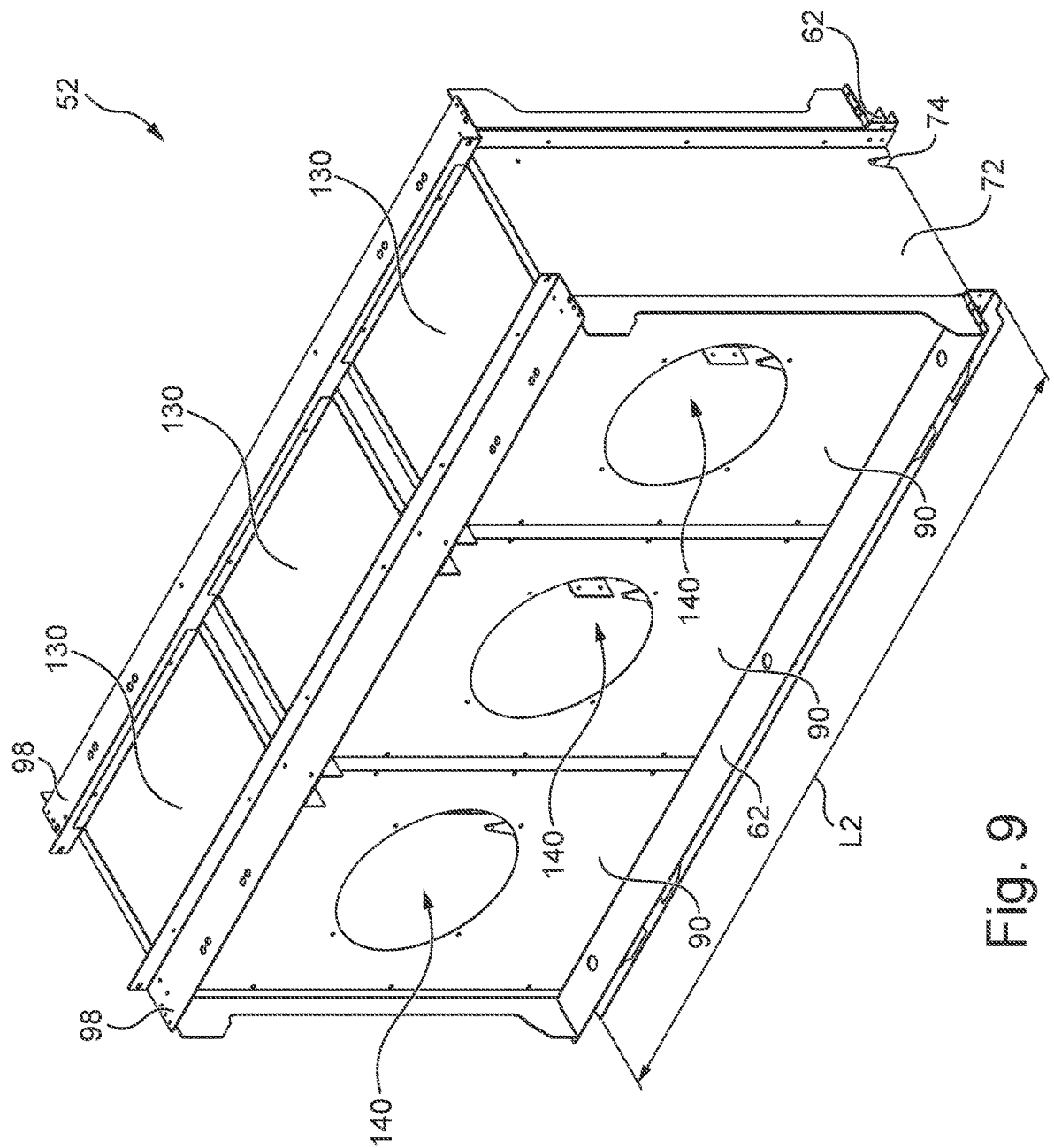
FIG. 9 is a front, right perspective view of the air handler rack frame in a final state of assembly.

As shown in FIG. 9, three top cover panels 130 are fastened to the upper support members 98, middle panels 76, and (for the two top cover panels 130 near the ends of the rack 50) to the end panels 72. Three horizontally-extending floor panels 131 (schematically shown in FIG. 4) are also provided longitudinally aligned with corresponding ones of the top cover panels 130. The floor panels 131 are fastened to the transversal walls 66 of the lower support members 62. The floor panels 131 may additionally or alternatively be fastened to the middle panels 76 and/or the end panels 72 (for the floor panels 131 near the ends of the rack 50). As shown in FIG. 4, each of the floor panels 131 is disposed vertically higher than the recesses 74 such as not to impede entry of a protrusion therein. Together, the middle panels 76, the end panels 72, the fan mounting panels 90, the top cover panels 130 and the floor panels 131 thus define three separate compartments 140 through which air is circulated from the air inlet side 58 to the air outlet side 60.

In this embodiment, the various components of the air handler rack frame 52 described above are sheet metal components. Nevertheless, it is contemplated that one or more of these components could be made differently in other embodiments.

The air handler rack frame 52 configured as described above provides a rigid structure that is capable of supporting substantial loads. Notably, the air handler rack frame 52 can support a load of at least 2 metric tons. For instance, in this embodiment, the air handler rack frame 52 can support a load of between 2 and 3 metric tons.

Figure 13:
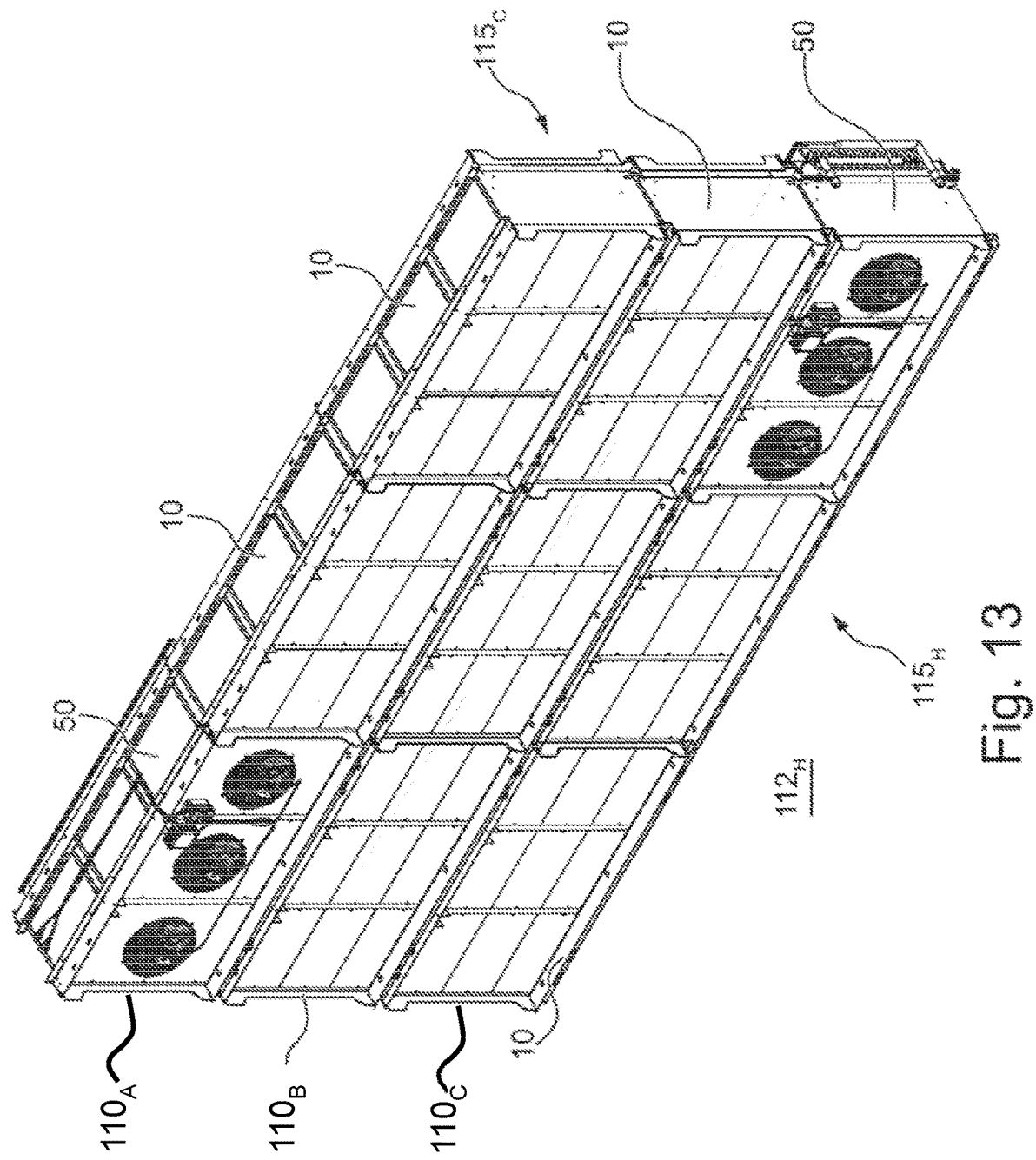
FIG. 13 is a front, left perspective view of an example of a row of racks of the data center of FIG. 1.

In fact, as will be noticed, the air handler rack frame 52 and the computer rack frame 12 are substantially similar. Notably, the air handler rack frame 52 and the computer rack frame 12 have similar dimensions. More specifically, in this example of implementation, the length L1 of the computer rack frame 12 is approximately equal (i.e., ±10%) to a length L2 of the air handler rack frame 52. Similarly, the height H1 of the computer rack frame 12 is approximately equal (i.e., ±10%) to a height H2 of the air handler rack frame 52. As shown in FIG. 13, the similar dimensions of the frames 12, 52 facilitate integration of the air handler racks 50 within the rows 110 since the air handler racks 50 take up substantially the same volume as the computer racks 10 and therefore maintain dimensional uniformity of the rows 110.

Furthermore, the fact that the computer racks 10 and the air handler racks 50 have their own respective frames 12, 52 also simplifies the process of building the rows 110. Notably, each row 110 can be built one rack at a time since the racks 10, 50 have their own frames 12, 52, allowing workers building the row 110 to have easy access to the site of where the next rack 10, 50 is to be positioned. In particular, the racks 10, 50 are positioned in place by a forklift which holds the racks 10, 50 from a lateral side thereof (i.e., facing the end panels 24, 72 of the frames 12, 52) such that the fork of the forklift is engaged between the parallel walls 19, 64 of the frames 12, 52. The forklift can position the racks 10, 50 in place in this way because the forklift can travel over the space which is laterally adjacent to where the rack 10, 50 is to be positioned and where a laterally-adjacent rack 10, 50 can be positioned afterward. Notably, in conventional data centers, the racks are often positioned in place from the front or rear (i.e., the forklift has to pass through the aisles between the rows of racks).

Moreover, because of this particular manner in which the rows 110 are built, the aisles 112 between the rows 110 do not need to have a width sufficient for a forklift to pass therethrough. In particular, and as will be explained in more detail below, the aisles 112, and particularly those aisles which workers will access during maintenance (i.e., cold aisles), need only be as wide as the depth of the equipment to be inserted into or retrieved from the racks 10, 50 which is considerably smaller than the aisle width in conventional data centers which needs to be sufficiently wide to allow a forklift therein so as to allow access to the racks. Thus, as will be understood, in the present technology, a greater amount of space within the data center 100 can be used for the racks 10, 50 (i.e., the aisles 112 have a smaller footprint) compared to conventional data centers, thus making the data center 100 more efficient in its use of space. Furthermore, in conventional data centers, if it were desired to make an aisle with a width that is less than that necessary to fit a forklift, a row of racks on one side of that aisle would have to be completed before the other row of racks on the other side of that aisle can begin being built, since the forklift would not be able to enter the reduced-width aisle once the second row of racks is being built.

In addition to the above, because the computer racks 10 and the air handler racks 50 have their own respective frames 12, 52, no additional frame is needed to build the rows 110. This can reduce associated costs and the need for additional welding, which also results in a reduced environmental impact.

The fans 56 are configured to pull air into the air handler rack 50 via the air inlet side 58 and propel the air toward the heat exchanger 54 at the air outlet side 60. Each fan 56 has blades mounted to a hub which are rotated by a corresponding motor (not shown) disposed inside each compartment 140. A grill 59 covers the fan blades to prevent debris from entering the air handler rack 50. The motor 57 is mounted to an outside of the grill 59. Each fan 56 is mounted to a corresponding one of the fan mounting panels 90. Notably, in this example of implementation, the grill 59 is fastened to the corresponding fan mounting panel 90 via the mounting features 96. The fans 56 are oriented such that a rotation axis of each fan 56 extends substantially horizontally (relative to the support surface 105).

In this embodiment, the air handler rack 50 includes three fans 56, each directing air through a corresponding one of the compartments 140. The three fans 56 are disposed side-by-side horizontally. It is contemplated that, in alternative embodiments, more or fewer fans may be provided. For example, in some embodiments, six fans 56 may be provided and each compartment 140 is divided into two sub-compartments by a divider panel (extending horizontally within the compartment 140) such that each of the six fans 56 forces air through a corresponding sub-compartment.

The heat exchanger 54 is configured to absorb heat from the air being circulated therethrough by the fans 56 and to transfer that heat to a cooling fluid flowing within the heat exchanger 54. In this example of implementation, the heat exchanger 54 is in the form of a panel extending along a majority (in this case, almost the entirety) of the length L2 of the air handler rack 50. A lower edge of the heat exchanger 54 is supported by the heat exchanger support members 80 of the air handler rack frame 52. The heat exchanger 54 may also be fastened to the lower and upper support members 62, 98.

As shown in FIGS. 3 and 4, the heat exchanger 54 has a coil 122 for circulating cooling fluid (e.g., water or refrigerant) therein. To that end, the coil 122 has a fluid inlet 124 for receiving cooling fluid into the coil 122, and a fluid outlet 126 for discharging cooling fluid from the coil 122. The cooling fluid is fed cold into the fluid inlet 124. For instance, the cooling fluid may first be cooled by a system of dry coolers equipped with an evaporative cooling system before being fed into the fluid inlet 124. In other embodiments, the cooling fluid may first be cooled by a condenser or chiller before being fed into the fluid inlet 124. At the fluid outlet 126, the cooling fluid exits having absorbed heat from the air circulated through the heat exchanger 54 by the fans 56. The heated cooling fluid is routed to the condenser and chiller for refrigeration and recirculation into the heat exchanger 54.

The heat exchanger 54 is supported by the heat exchanger support members 80. The heat exchanger 54 is also retained in place by a retaining bracket (not shown) that engages a top of the heat exchanger 54 and is secured to the vertical beams 70.

In order to increase the surface area for effecting heat transfer, the heat exchanger 54 has fins (not shown) in thermal communication with the coil 122. As air flows through the heat exchanger 54, heat is transferred to the fins and the coil 122 and transmitted to the cooling fluid flowing in the coil 122.

Thus, in use, air is taken from the air inlet side 58 of the air handler rack 50 and blown, by the fans 56, to the air outlet side 60 of the air handler rack 50. Heat is transferred from the air traversing the heat exchanger 54 to the cooling fluid flowing in the coil 122. As such, the temperature of the air traversing the heat exchanger 54 is lowered, resulting in cooler air exiting the air handler rack 50 at the air outlet side 60.

In this embodiment, the coil 122 extends substantially across the entire length L2 of the air handler rack frame 52. As such, the coil 122 extends across multiple ones of the fans 56, and more particularly across all three of the fans 56.

In some embodiments, the air handler rack 50 may comprise a protective grill disposed on the air outlet side 54 to protect the heat exchanger 54 from debris.

The above-described configuration of the air handler rack 50 facilitates maintenance, modification and upgrading thereof. Notably, the air handler rack 50 does not need to be removed from its row 110 in order to maintain or modify the heat exchanger 54 or the fans 56 thereof. Rather, the heat exchanger 54 and the fans 56 can be replaced or modified in place manually by an operator without having to remove the air handler rack 50 from the row 110. For example, an operator can remove the heat exchanger 54 in place and replace it with a more performant heat exchanger if desired. In some cases, one or two additional heat exchangers may even be added to the air handler rack 50 for redundancy purposes.

The computer rack frame 12 and the air handler rack frame 52 are interchangeably stackable with one another. Thus, a computer rack 10 can be stacked with another computer rack 10 and/or with an air handler rack 50. Similarly, an air handler rack 50 can be stacked with another air handler rack 50 and/or with a computer rack 10.

In order to stack the computer rack 10 (which will be referred to as the "top" computer rack 10 for clarity) atop another "bottom" computer rack 10 or atop an air handler rack 50, the lower parallel walls 19 of the top computer rack 10 are lowered onto the horizontally extending portions 30 of the upper support members 18 of the bottom computer rack 10 or, if being stacked atop an air handler rack 50, onto the horizontally extending portions 118 of the upper support members 98 of the air handler rack 50. The upwardly extending portions 28 of the upper support members 18 of the bottom computer rack 10 or the upwardly extending portions 116 of the upper support members 98 of the air handler rack 50 are inserted into the recesses 26 of the top computer rack 10 (as well as into the recesses of the panels 23).

Similarly, in order to stack the air handler rack 50 (which will be referred to as the "top" air handler rack 50 for clarity) atop another "bottom" air handler rack 50 or atop a computer rack 10, the lower parallel walls 64 of the top air handler rack 50 are lowered onto the horizontally extending portions 118 of the upper support members 98 of the bottom air handler rack 50 or, if being stacked atop a computer rack 10, onto the horizontally extending portions 30 of the upper support members 18 of the computer rack 10. The upwardly extending portions 116 of the upper support members 98 of the bottom air handler rack 50 or the upwardly extending portions 28 of the upper support members 18 of the computer rack 10 are inserted into the recesses 74 of the top air handler rack 50.

As briefly mentioned above, a positioning tool can be used to facilitate the stacking of the air handler rack 50 onto another rack (10 or 50). For instance, if being stacked atop the bottom air handler rack 50, a protrusion of the positioning tool is inserted into one of the openings 120 of the horizontally extending portion 118 of one of the upper support members 98 of the bottom air handler rack 50 to affix the positioning tool thereto. The positioning tool is then used to guide the stacking of the top air handler rack 50 atop the bottom air handler rack 50. Notably, the tool-receiving openings 68 in the lower support members 62 of the top air handler rack 50 are aligned with the positioning tool and then lowered onto the bottom air handler rack 50. The user may then secure the air handler racks 50 together in any suitable manner. For example, the air handler racks 50 may be fastened together by inserting fasteners in corresponding openings of each air handler rack 50. An example of such a method of stacking racks is described in greater detail in European Patent Application EP 17315013.7, filed Dec. 12, 2017, which is incorporated in its entirety by reference herein (in jurisdictions that allow such incorporation by reference). The computer racks 10 can be stacked in a similar manner, notably via the apertures 22 and the openings 29. Furthermore, since the lower and upper support members of the air handler racks 50 and the computer racks 10 are configured similarly, the positioning tool can also be used to stack the air handler racks 50 with the computer racks 10. It is contemplated that, in other embodiments, no such positioning tool is used for stacking the racks 10, 50.

The stackability of the air handler racks 50 with the computer racks 10 can facilitate planning of the layout of the data center 100. Notably, no floor space within the data center 100 needs to be reserved for air handler units since the air handler racks 50 can simply be stacked atop the computer racks 10. For instance, in one example of implementation, installation of the computer racks 10 may be done as desired without regard to heat management of the data center 100. Once the computer racks 10 are in place, the air handler racks 50 can be stacked as desired atop the computer racks 10 to address heat management. Moreover, even if one of the air handler racks 50 is placed on the ground surface 105 and thus occupies floor space, the server capacity of the data center 100 can still be expanded in the future by stacking one or more computer racks 10 atop that air handler rack 50.

Figure 12:
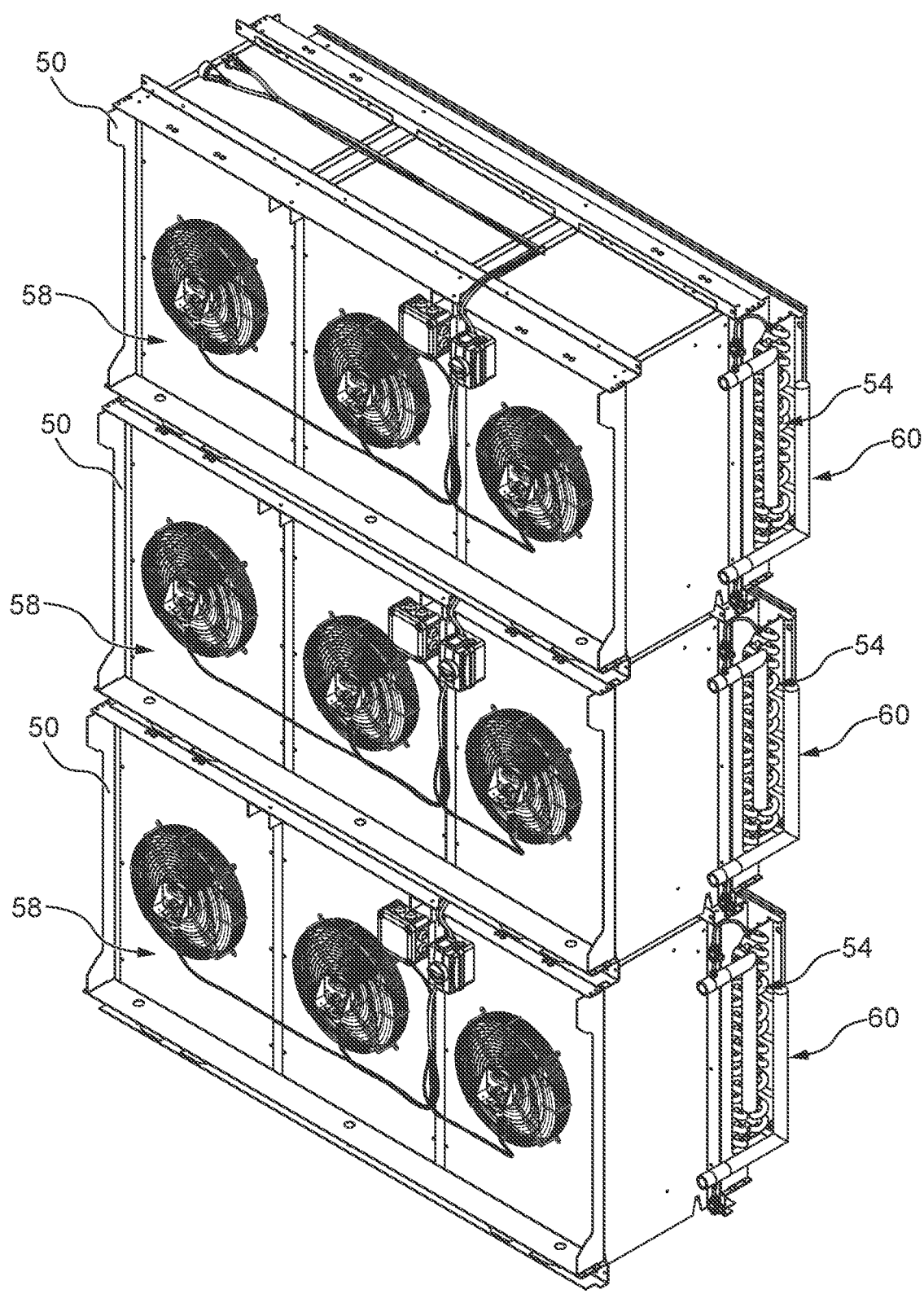
FIG. 12 is a front, left perspective view of a configuration for stacking multiple air handler racks atop one another.

Furthermore, the air handler racks 50 can also be stacked atop one another (see FIG. 12 for example). This can allow increasing the air cooling provided at particular locations within the data center 100 as desired. For example, in a case where one of the air handler racks 50 does not sufficiently cool air at the location where that air handler rack 50 is positioned, one or more other air handler racks 50 can be stacked thereon to provide additional air cooling.

The horizontally-extending nature of both the frames 12, 52 of the computer racks 10 and air handler racks 50 allows a greater amount of racks 10, 50 to be stacked atop one another. Notably, because the frames 12, 52 extend horizontally whereas their heights are smaller, a greater amount of racks 10, 50 (e.g., three or more racks 10, 50) can be stacked atop one another before being limited by the ceiling of the data center 100. This allows not only a greater amount of computer racks 10 to be installed in the data center 100, but also greater flexibility for accommodating more air handler racks 50 atop one another to increase the air cooling at particular locations of the data center 100 as detailed above. In addition, this may facilitate selecting a facility for implementing the data center 100 since a significant ceiling height is not required.

The air handler racks 50 can be stacked with the computer racks 10 in various configurations.

Figure 10:
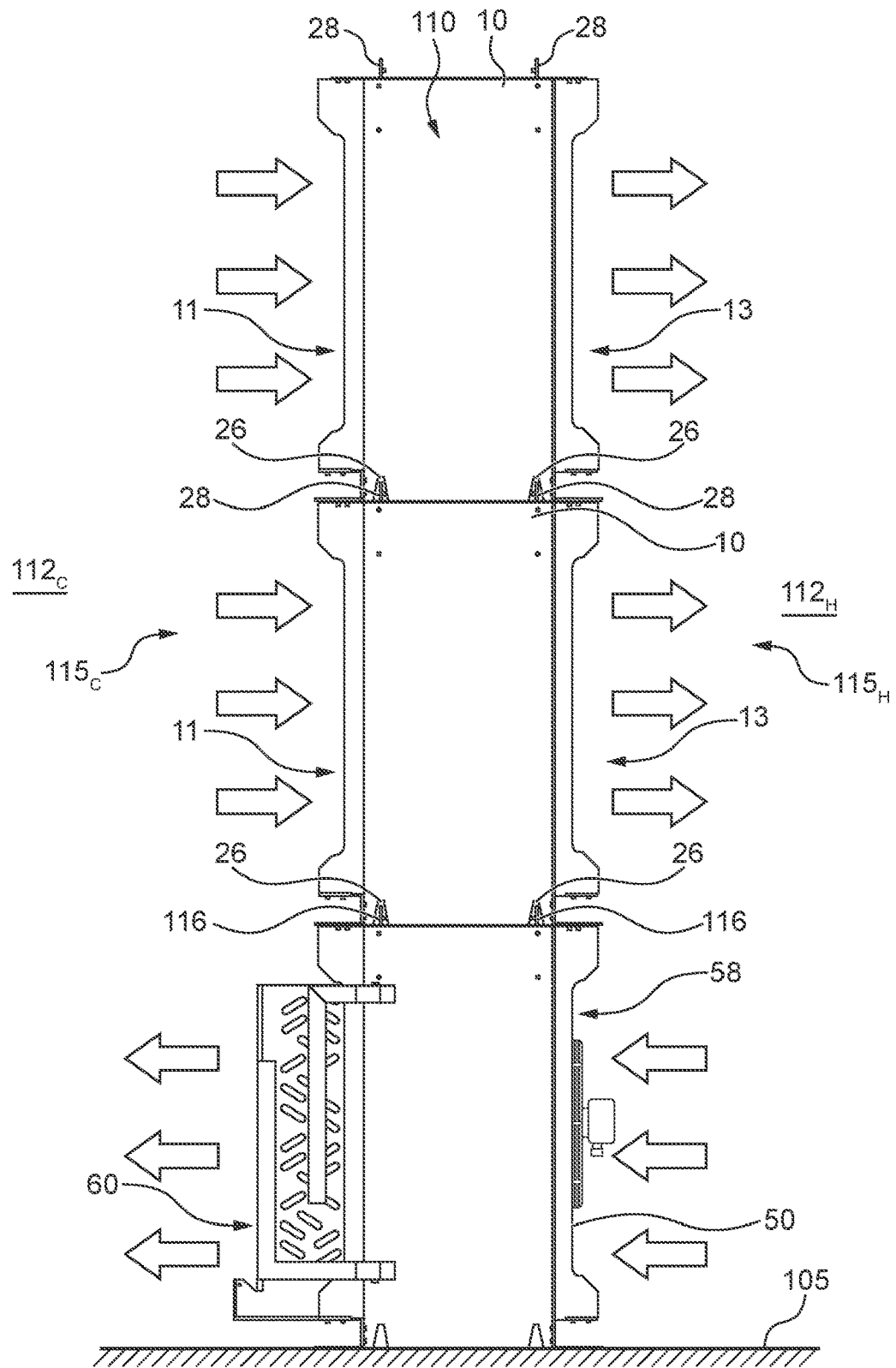
FIG. 10 is a left side elevation view of a configuration for stacking the air handler rack with the computer rack.

For instance, with reference to FIG. 10, in some embodiments, two or more computer racks 10 can be stacked atop one of the air handler racks 50 supported on the ground surface 105. Notably, since, as discussed above, the air handler rack frame 52 can support significant loads, the air handler rack 50 is capable of supporting two or more computer racks 10 stacked thereon.

Figure 11:
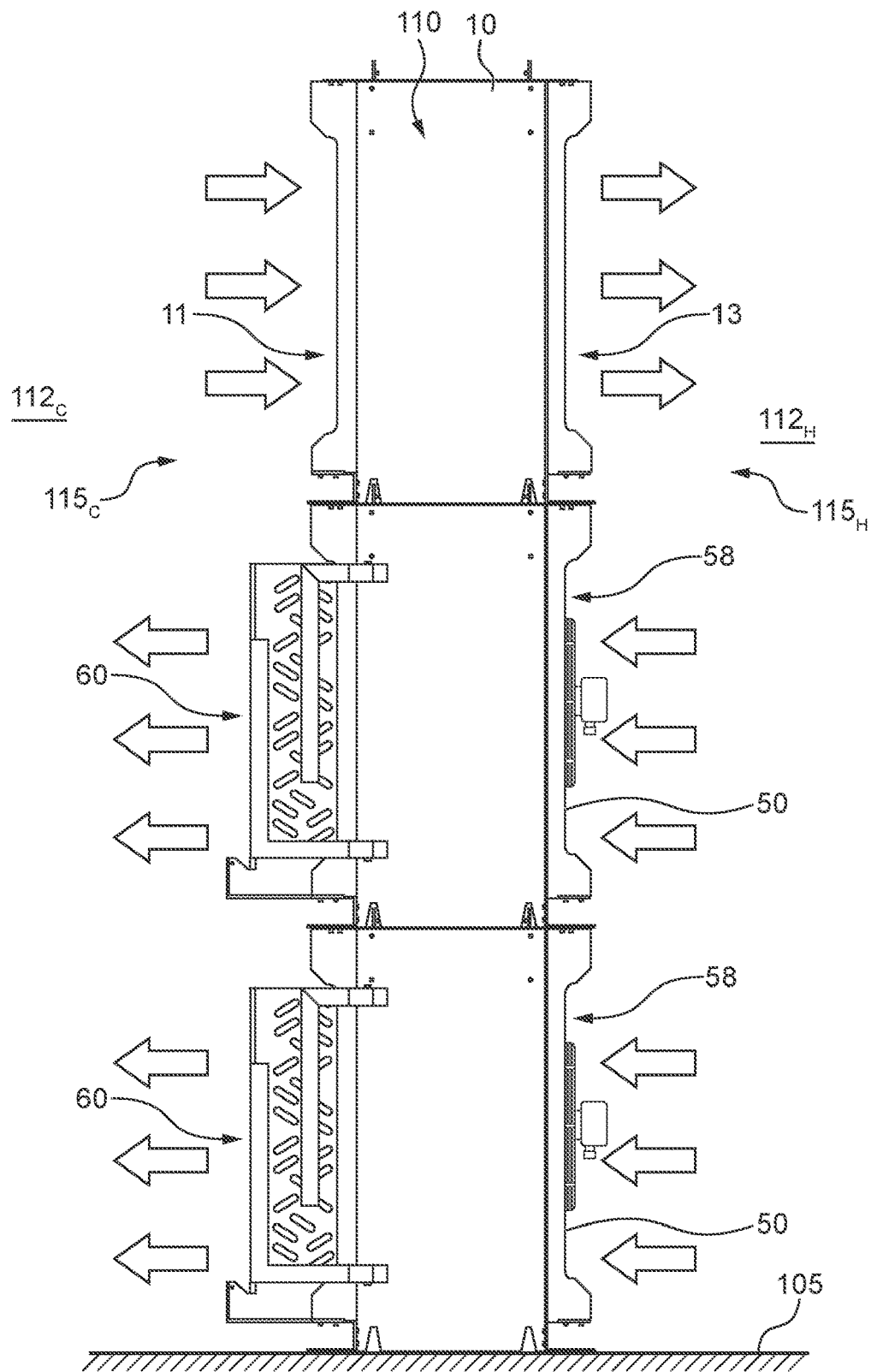
FIG. 11 is a left side elevation view of another configuration for stacking the air handler rack with the computer rack.

As previously mentioned, the air handler racks 50 can also be stacked atop one another, as shown in FIGS. 11 and 12 for example. In FIG. 11, a computer rack 10 is stacked atop two air handler racks 50 that are stacked atop one another. In FIG. 12, three air handler racks 50 are stacked atop one another. Stacking the air handler racks 50 increases the air cooling at a specific location of one of the aisles 112. This allows increasing air cooling according to heat management requirements at that given location without having to occupy additional floor space or space above other computer racks 10. This may be helpful for example in situations where a "hot spot" (i.e., a location where particularly elevated temperatures are attained) is present in the data center 100 and the addition of a single air handler rack 50 does not sufficiently dissipate heat at the hot spot.

FIG. 13 shows an example of the rows 110 of the data center 100. As shown, in this embodiment, the rows 110 include two air handler racks 50. More specifically, in a bottom row, one of the air handler racks 50 is supported on the ground surface 105 of the data center 100 with two computer racks 10 stacked thereon. In a top row, another of the air handler racks 50 is stacked atop two of the computer racks 10.

The aisles 112 between the rows 110 can be categorized as "cold" aisles $112_C$ from which cool air is taken to pass through the computer racks 10 to cool the computer equipment 25 stored therein, and as "hot" aisles $112_H$ into which heated air is discharged by the computer equipment 25 stored in the computer racks 10. As such, each row 110 has a cold aisle side $115_C$ facing one of the cold aisles $112_C$ and a hot aisle side $115_H$ (opposite the cold aisle side 115) facing one of the hot aisles $112_H$. As will be understood from FIGS. 10, 11 and 13, in a given row 110, when the air handler racks 50 are stacked with one or more of the computer racks 10, the air inlet sides 58 of the air handler racks 50 and the air outlet sides 13 of the computer racks 10 face a same direction. More specifically, the air inlet sides 58 of the air handler racks 50 and the air outlet sides 13 of the computer racks 10 are on the cold aisle side $115_C$ of the row 110. Therefore, in a given row 110, the computer racks 10 discharge heated air into a hot aisle $112_H$ and the air handler racks 50 suck in heated air from the hot aisle $112_H$ (on the air inlet sides 58 of the air handler racks 50) and discharge cooled air into the opposite cold aisle $112_C$ (on the air outlet sides 60 of the air handler racks 50). The computer racks 10 take in air from the cold aisle $112_C$ to cool the computer equipment 25. As such, recirculation of air from the cold aisle $112_C$ to the hot aisle $112_H$ on opposite sides of a given row 110 is ensured by the air handler racks 50.

The above-described configuration of the data center 100 is also easy to modify. Notably, if it is desired to replace a given one of the air handler racks 50 with a computer rack 10 (e.g., if it is determined that additional cooling is required in the location of that computer rack 10), then the computer rack 10 can be easily converted into an air handler rack 50. In particular, the computer equipment 25 (e.g., servers) held by the frame 12 is removed manually and, since the frame 12 is similar to the frame 52, a heat exchanger 54 and corresponding fans 56 are installed manually on the frame 12 in the same manner that they would be to the frame 52 by affixing corresponding supporting plates to the frame 12. In the same manner, an air handling rack 50 can be modified to be converted into a computer rack 10. The data center 100 is therefore easily adaptable to changing requirements. Moreover, as will be understood, forklifts or other material handling machinery are not needed to make modifications to the configuration of the rows 110 of the data center 100 since the equipment required to convert a computer rack 10 into an air handler rack 50 (and vice-versa) can be installed manually. Thus, as mentioned above, the aisles 112 do not need to have a width sufficient for a forklift to pass therethrough. In particular, the cold aisles 112$_C$ (which are the aisles that workers will access to perform maintenance or modifications to the racks 10, 50) can simply be made as wide as the depth of the equipment to be inserted into or retrieved from the racks 10, 50. For instance, in one example of implementation, the cold aisles 112$_C$ can have a width of approximately 60 cm while the hot aisles 112$_H$ can have an even smaller width (since the equipment will not be removed via the hot aisles 112$_H$) such as approximately 40 cm. Therefore, a greater amount of the data center's surface area can be used for the racks 10, 50 rather than having wide aisles between the rows of racks. Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A rack arrangement for a data center, comprising:
a plurality of rows of racks, the rack rows being aligned with each other in a parallel row configuration, each of the rack rows having a cold aisle side and a hot aisle side opposite the cold aisle side, further comprising:
   a plurality of computer racks, each computer rack having an air inlet side for ingress of air into the computer rack and an air outlet side for egress of air out of the computer rack, each computer rack containing a computer rack frame that comprises a plurality of housing units for housing computer equipment;
   a first air handler rack and a second air handler rack, each having a respective air inlet side and an air outlet side, the first air handler rack comprising:
      a first air handler rack frame, in which the first air handler rack frame and the computer rack frame are configured to be interchangeably stackable atop one another;
      a first heat exchanger supported by the first air handler rack frame, the first heat exchanger comprising a first coil for circulating cooling fluid therein, the first coil having a fluid inlet for receiving cooling fluid into the first coil and a fluid outlet for discharging cooling fluid from the first coil; and
      at least one first fan supported by the first air handler rack frame, the at least one first fan being configured for pulling air into the first air handler rack via the air inlet side of the first air handler rack and discharging air via the air outlet side of the first air handler rack, the at least one first fan directing air through the first heat exchanger;
   the second air handler rack comprising:
      a second air handler rack frame;
      a second heat exchanger supported by the second air handler rack frame, the second heat exchanger comprising a second coil for circulating fluid therein, the second coil of the second heat exchanger having a fluid inlet for receiving cooling fluid into the second coil and a fluid outlet for discharging cooling fluid from the second coil; and
      at least one second fan supported by the second air handler rack frame, the at least one second fan being configured for pulling air into the second handler rack via an air inlet side of the second air handler rack and discharging air via an air outlet side of the second air handler rack, the at least one second fan directing air through the second heat exchanger,
   wherein, the air inlet side of any one of the computer racks and the air outlet side of the first and second air handler racks are disposed on the cold aisle side of the rack rows, and at least one selected rack of the rack rows being stacked atop the first air handler rack such that the first air handler rack frame supports the at least one selected rack,
   wherein the at least one selected rack comprises a third air handler rack stacked atop the second air handler rack in which the third air handler rack comprises a third air handler rack frame and a third heat exchanger supported by the third air handler rack frame, and
   wherein, the third heat exchanger includes a coil for circulating cooling fluid therein, in which the coil of the third heat exchanger contains a fluid inlet for receiving cooling fluid into the coil and a fluid outlet for discharging cooling fluid from the coil and at least one third fan supported by the third air handler rack frame, such that the at least one third fan is configured for pulling air into the third air handler rack via an air inlet side of the third air handler rack, discharging air via an air outlet side of the third air handler rack, and directing air through the third heat exchanger.

2. The rack arrangement of claim 1, wherein the at least one selected rack comprises a first computer rack and a second computer rack of the plurality of computer racks.

3. The rack arrangement of claim 1, wherein the at least one selected rack is stacked atop the second air handler rack.

4. The rack arrangement of claim 1, wherein at least one of the first and second air handler racks is supported on a ground surface of the data center.

5. The rack arrangement of claim 1, wherein at least one of the first and second air handler racks is stacked atop at least one computer rack of the plurality of computer racks.

6. The rack arrangement of claim 1, wherein a length of the computer rack frame is greater than a height of the computer rack frame.

7. The rack arrangement of claim 6, wherein:
the first and second air handler rack frames have a length that is approximately equal to the length of the computer rack frame; and
the first and second air handler rack frames have a height that is approximately equal to the height of the computer rack frame.

8. The rack arrangement of claim 1, wherein the at least one first and second fans comprise a plurality of fans, the plurality of fans being disposed side-by-side horizontally.

9. The rack arrangement of claim 8, wherein the first and second coils extend across each of the plurality of fans.

10. A method of arranging racks in a data center, the method comprising:
forming a plurality of rows of racks, the rack rows being aligned with each other in a parallel row configuration, each of the rack rows having a cold aisle side and a hot aisle side opposite the cold aisle side and further comprises:
- a plurality of computer racks, each computer rack containing a computer rack frame that comprises a plurality of housing units for housing computer equipment;
- a first air handler rack and a second air handler rack, the first air handler rack comprising:
  - a first air handler rack frame, in which a computer rack frame and the first air handler rack frame are configured to be interchangeably stackable atop one another;
  - a first heat exchanger supported by the first air handler rack frame, the first heat exchanger comprising a first coil for circulating cooling fluid therein, the first coil having a fluid inlet for receiving cooling fluid into the first coil and a fluid outlet for discharging cooling fluid from the first coil; and
  - at least one first fan supported by the first air handler rack frame, the at least one first fan being configured for pulling air into the first air handler rack via an air inlet side of the air handler rack and discharging air via an air outlet side of the first air handler rack, the at least one first fan directing air through the first heat exchanger,
- the second air handler rack comprising:
  - a second air handler rack frame;
  - a second heat exchanger supported by the second air handler rack frame, the second heat exchanger comprising a second coil for circulating fluid therein, the second coil of the second heat exchanger having a fluid inlet for receiving cooling fluid into the second coil and a fluid outlet for discharging cooling fluid from the second coil; and
  - at least one second fan supported by the second air handler rack frame, the at least one second fan being configured for pulling air into the second air handler rack via an air inlet side of the second air handler rack and discharging air via an air outlet side of the second air handler rack, the at least one second fan directing air through the second heat exchanger,
- arranging the air inlet side of any one of the computer racks and the air outlet side of the first and second air handler racks on the cold aisle side of the rack rows; and
- stacking at least one selected rack atop the first air handler rack such that the first air handler rack frame supports the at least one selected rack,
- wherein the at least one selected rack comprises a third air handler rack stacked atop the second air handler rack in which the third air handler rack comprises a third air handler rack frame and a third heat exchanger supported by the third air handler rack frame, and
- wherein, the third heat exchanger includes a coil for circulating cooling fluid therein, in which the coil of the third heat exchanger contains a fluid inlet for receiving cooling fluid into the coil and a fluid outlet for discharging cooling fluid from the coil and at least one third fan supported by the third air handler rack frame, such that the at least one third fan is configured for pulling air into the third air handler rack via an air inlet side of the third air handler rack, discharging air via an air outlet side of the third air handler rack, and directing air through the third heat exchanger.

* * * * *